(12) United States Patent
Suh et al.

(10) Patent No.: US 10,707,324 B2
(45) Date of Patent: Jul. 7, 2020

(54) GROUP IIIA-N HEMT WITH A TUNNEL DIODE IN THE GATE STACK

(71) Applicant: TEXAS INSTRUMENTS INCORPORATED, Dallas, TX (US)

(72) Inventors: Chang Soo Suh, Allen, TX (US); Dong Seup Lee, McKinney, TX (US); Jungwoo Joh, Allen, TX (US); Naveen Tipirneni, Plano, TX (US); Sameer Prakash Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/456,040

(22) Filed: Jun. 28, 2019

(65) Prior Publication Data
US 2019/0319111 A1    Oct. 17, 2019

Related U.S. Application Data

(62) Division of application No. 15/587,021, filed on May 4, 2017, now Pat. No. 10,381,456.

(51) Int. Cl.
| | |
|---|---|
| H01L 29/66 | (2006.01) |
| H01L 29/778 | (2006.01) |
| H01L 29/10 | (2006.01) |
| H01L 21/8252 | (2006.01) |
| H01L 27/06 | (2006.01) |
| H01L 27/085 | (2006.01) |
| H01L 23/535 | (2006.01) |
| H01L 29/20 | (2006.01) |
| H01L 27/07 | (2006.01) |
| H01L 27/088 | (2006.01) |

(52) U.S. Cl.
CPC .... *H01L 29/66462* (2013.01); *H01L 21/8252* (2013.01); *H01L 23/535* (2013.01); *H01L 27/0605* (2013.01); *H01L 27/085* (2013.01); *H01L 29/1066* (2013.01); *H01L 29/7786* (2013.01); *H01L 27/0727* (2013.01); *H01L 27/0883* (2013.01); *H01L 29/2003* (2013.01)

(58) Field of Classification Search
CPC .................................................... H01L 29/7787
USPC ........................................................ 257/76
See application file for complete search history.

(56) References Cited

U.S. PATENT DOCUMENTS

| | | | |
|---|---|---|---|
| 5,665,978 A * | 9/1997 | Uenoyama | H01L 29/8616 257/30 |
| 7,015,497 B1 * | 3/2006 | Berger | B82Y 10/00 257/14 |
| 8,933,486 B2 | 1/2015 | Wu | |
| 9,054,027 B2 | 6/2015 | Pendharkar et al. | |
| 9,337,023 B1 | 5/2016 | Fareed et al. | |

(Continued)

*Primary Examiner* — Jami Valentine Miller
(74) *Attorney, Agent, or Firm* — Andrew R. Ralston; Charles A. Brill; Frank D. Cimino

(57) ABSTRACT

One example provides an enhancement-mode High Electron Mobility Transistor (HEMT) includes a substrate, a Group IIIA-N active layer over the substrate, a Group IIIA-N barrier layer over the active layer, and at least one isolation region through the barrier layer to provide an isolated active area having the barrier layer on the active layer. A gate stack is located between source and drain contacts to the active layer. A tunnel diode in the gate stack includes an n-GaN layer on an InGaN layer on a p-GaN layer located on the barrier layer.

21 Claims, 10 Drawing Sheets

(56) References Cited

U.S. PATENT DOCUMENTS

| | | | | |
|---|---|---|---|---|
| 9,761,675 B1* | 9/2017 | Marinella | ............. | H01L 23/291 |
| 2003/0121468 A1* | 7/2003 | Boone | ..................... | C30B 23/02 |
| | | | | 117/78 |
| 2005/0056210 A1* | 3/2005 | El-Zein | ............. | H01L 21/02381 |
| | | | | 117/89 |
| 2005/0253139 A1* | 11/2005 | Gorman | ............. | G11C 13/0014 |
| | | | | 257/46 |
| 2016/0104743 A1* | 4/2016 | Tchelnokov | .......... | H01L 25/167 |
| | | | | 257/91 |

\* cited by examiner

US 10,707,324 B2

GROUP IIIA-N HEMT WITH A TUNNEL DIODE IN THE GATE STACK

CROSS REFERENCE TO RELATED APPLICATIONS

Under 35 U.S.C. § 120, this divisional application claims the benefit of and priority to U.S. patent application Ser. No. 15/587,021, filed May 4, 2017, the entirety of which is hereby incorporated herein by reference.

FIELD

Disclosed embodiments relate to Group IIIA-N (e.g., Gallium Nitride) High Electron Mobility Field Effect Transistors (HEMTs).

BACKGROUND

Gallium-nitride (GaN) is a commonly used Group IIIA-N material for electronic devices, where Group IIIA elements such as Ga (as well as boron, aluminum, indium, and thallium) are also sometimes referred to as Group 13 elements. GaN is a binary Group IIIA/V direct band gap semiconductor that has a Wurtzite crystal structure. Its relatively wide band gap of 3.4 eV at room temperature (vs. 1.1 eV for silicon at room temperature) affords it special properties for a wide variety of applications in optoelectronics, as well as high-power and high-frequency electronic devices.

GaN-based HEMTs are known which feature a junction between two materials with different band gaps to form a heterojunction (or 'heterostructure'). The HEMT structure is based on a very high electron mobility, described as a two-dimensional electron gas (2DEG) which forms just below a heterostructure interface between a barrier layer (that typically comprises AlGaN) on a generally intrinsic active layer (that typically comprises GaN) due to the piezoelectric effect and a natural polarization effect. As with any power field effect transistor (FET) device, there is a gate, source electrode, and drain electrode, where the source electrode and the drain electrode each include contacts that generally extend through a portion of the barrier layer to form a low resistance ohmic contact with the underlying 2DEG in the surface of the active layer.

Known enhancement-mode (E-mode) Group IIIA-N HEMTs generally utilize a p-GaN layer between the metal gate and the barrier layer to provide enhancement-mode operation (threshold voltage ($V_T$)>0, so normally off). Magnesium (Mg) is the usual p-type dopant specie used in Group IIIA-N materials for-doping this p-GaN layer.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize known E-mode Group IIIA-N HEMTs utilizing a Mg doped GaN layer as the p-GaN layer between the metal gate and the barrier layer to provide E-mode operation exhibit poor doping efficiencies. The poor doping efficiency is due to a low ionization percentage stemming from deep nature of Mg as a dopant in Ga (generally about 0.2 eV or greater at room temperature for Mg on a Ga lattice site) so that high concentrations of Mg are needed to generate sufficient hole densities in GaN, and the overall electrical conductivity of the Mg doped GaN layer is still typically low. As a result, fabricating uniform low-resistance gate contacts to the Mg doped GaN layer is difficult and often requires particular metal gate materials to lower the series gate resistance somewhat, such as Pd, Ni, Pt, and Indium-Tin-Oxide (ITO), which are typically unavailable in silicon-based fabrication facilities.

Disclosed E-mode Group IIIA-N HEMTs add a tunnel diode in the gate stack that eliminates the need to form gate contacts directly to the Mg doped GaN or other p-GaN layer. The tunnel diode enables the use of an n-type contact for the gate of the E-mode Group IIIA-N HEMT instead of a p-type contact. This provides the advantage of being able to use conventional gate electrode materials such as Ti or Al commonly available in silicon fabs.

As used herein and known in the art for use as a discrete device, a tunnel diode has heavy doping on both of its sides with a minimum doping level of $10^{18}$ cm$^{-3}$ to provide a narrow depletion layer width that is generally on the order of 10 nm, which provides in operation a distinctive negative differential resistance in part of its operating range. Due to the large energy bandgap of Group IIIA-N semiconductors, it is recognized to be very difficult/nearly impossible to get tunneling to occur without an $In_xGa_{1-x}N$ layer (hereafter an InGaN layer) which can either be doped p-type, n-type or be unintentionally doped, between the p-GaN layer and the n-type GaN layer. InGaN is known to be a semiconductor material having a mixture of gallium nitride (GaN) and indium nitride (InN), and is a ternary group III/group V direct bandgap semiconductor having a bandgap that is tunable by varying the concentration of In in the InGaN material. InGaN is recognized to be capable of having a narrower bandgap compared to GaN, and more importantly to provide built-in polarization fields that help create a band offset in a much thinner layer than a traditional GaN-based semiconductor diode. Moreover, for disclosed E-mode Group IIIA-N HEMTs the thickness of the InGaN layer is recognized to be a new available 'knob' that enables the new device design capability of independently increasing the $V_T$ of the E-mode Group IIIA-N HEMT without negatively impacting its on-resistance (RON).

BRIEF DESCRIPTION OF THE DRAWINGS

Reference will now be made to the accompanying drawings, which are not necessarily drawn to scale, wherein:

FIG. 6A shows a band diagram in the region under the gate stack of a disclosed E-mode Group IIIA-N HEMT as a function of depth for a conventional non-graded tunnel diode heterojunction, while

DETAILED DESCRIPTION

Figure 1:
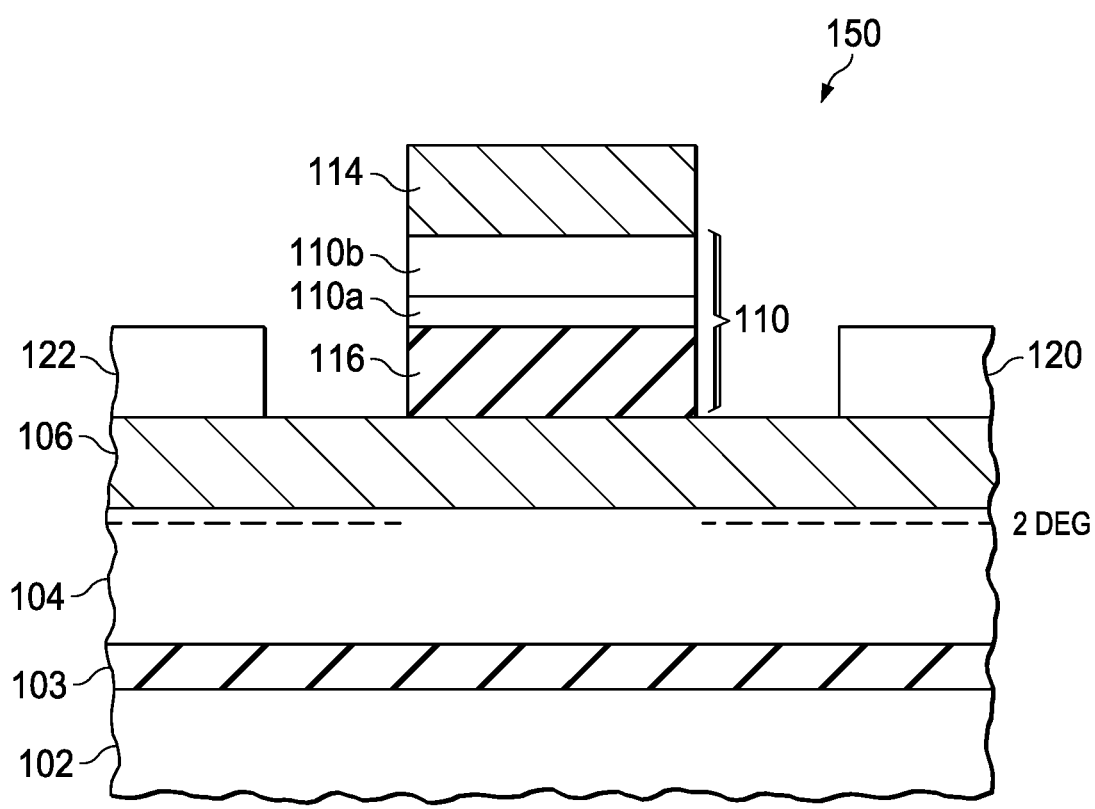
FIG. 1 is a cross-sectional diagram of a disclosed E-mode Group IIIA-N HEMT having a tunnel diode in the gate stack, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

As described above, disclosed E-mode HEMTs include a tunnel diode in the gate stack, and have a different gate metallization as compared to known E-mode HEMTs. FIG. 1 is a cross-sectional diagram of a disclosed E-mode Group IIIA-N HEMT (E-mode HEMT) 150 having a tunnel diode 110 in the gate stack. It is the 3-layer stack shown comprising the n-GaN layer 110b on an InGaN layer 110a on a p-GaN layer 116 that forms the tunnel diode 110. Unlike known E-mode HEMTs, E-mode HEMT 150 utilizes n-GaN gate contacts (rather than p-GaN gate contacts required by known E-mode HEMTs) which are much easier to form, provides a lower RON that is also more uniform as compared to conventional p-GaN contacts for E-mode HEMTs, and as described above can utilize conventional metal generally available in a semiconductor fab such as Ti, Al, or TiN based metals or metal stacks.

E-mode HEMT 150 comprises a substrate 102, at least one Group IIIA-N buffer layer 103 on the substrate 102, a Group IIIA-N active layer (active layer) 104 on the buffer layer 103, and a Group IIIA-N barrier layer 106 on the active layer 104. As known in the art, the 2DEG shown is formed in the active layer 104 near its heterojunction throughout its interface with the barrier layer 106. The barrier layer 106, the active layer 104 and the buffer layer 103 are generally all epitaxial layers on the substrate 102. A patterned masking material (e.g., photoresist) is used to etch through the barrier layer 106 to define the isolation regions 115 (see isolation regions 115 in FIG. 5 described below) which provides borders for the active areas.

The substrate 102 can comprises sapphire, silicon, silicon carbide (SiC) or GaN. The Group IIIA-N buffer layer 103 is generally present on the substrate 102, but is not needed when a gallium nitride (GaN) substrate is used. The active layer 104 can comprise, for example, 1 nm to 5,000 nm (5 μm) of GaN. The active layer 104 may be formed so as to minimize crystal defects which may have an adverse effect on electron mobility. The active layer 104 is commonly undoped (e.g., undoped GaN).

The barrier layer 106 can comprise, for example, 1 to 50 nanometers of $Al_xGa_{1-x}N$ or $In_xAl_yGa_{1-x-y}N$. A composition of Group IIIA elements in the barrier layer 106 may be, for example, 5 to 35 percent atomic weight aluminum nitride and 65 to 95 percent atomic weight GaN. Forming the barrier layer 106 on the active layer 104 generates a 2DEG in the active layer 104 throughout its interface with the barrier layer 106 just below the barrier layer 106, with an electron density of, for example, $1 \times 10^{12}$ to $2 \times 10^{13}$ cm$^{-2}$. The barrier layer 106 may include an optional capping layer, for example comprising GaN, on a top surface of the barrier layer 106.

A patterned masking material functioning as an isolation mask is used to form isolation regions 115 that define at least isolated active area from the barrier layer 106 on top of the active layer 104. Isolation regions 115 generally that lack the barrier layer 106 which surround an isolated active area 106/104 having the barrier layer 106 on the active layer 104 to provide the 2DEG shown. An isolation mask using a patterned masking material may include, for example, 200 nanometers to 2 microns of photoresist formed by a photolithographic process. The forming the isolation regions 115 can comprise a Mesa etch process. For example, a blanket barrier layer 106 can be patterned using a greyscale mask followed by an etch to provide rounded edges. A Mesa etch process besides etching through the barrier layer 106 also generally removes a portion of the active layer 104.

A gate 114, drain 120 with a drain contact and a source 122 with source contact are formed within the active areas 106/104. The gate 114 is shown formed over the p-GaN layer 116 which is on the barrier layer 106. The source contacts and drain contacts are generally formed by a masked etch process that selectively etches part of the thickness of the barrier layer 106 to extend into the barrier layer 106 to provide good (low resistance ohmic) contact to the 2DEG in the active layer 104 near the interface between the barrier layer 106 and the active layer 104.

Although not shown in the view provided, the source 122 can form a complete loop that encircles the drain and the drain can be configured as fingers. The gate 114, drain 120 including drain contact and the source 122 including the source contact all generally comprise a metal. Because of the p-GaN layer 116 on the gate area as described above due to contact resistance considerations (contacts to the p-GaN layer 116 are barrier/tunneling type contacts, and thus very resistive) it is generally required to use metals such as Ni, Pt, Pd, or Indium tin oxide (ITO) for the source and drain (so that this material is used for the gate too) that are normally not available in semiconductor fab. Although not shown, the source and the drain metal layers are generally on top of a dielectric layer that is on top of the barrier layer 106 and over the gate 114 to prevent shorts to the gate 114. The respective electrodes can be formed by sputtering.

The $V_T$ and RON for a known E-mode HEMT is primarily determined by the barrier layer 106 (e.g., AlGaN) thickness and Al % in the case of AlGaN for the barrier layer 106. One thus cannot independently control the $V_T$ and the on-resistance (RON) for this known E-mode HEMTs with the barrier layer 106 (e.g., AlGaN) thickness and its Al % so that there is thus always a trade-off where a more positive $V_T$ leads to a higher RON. The p-GaN layer 116 doping/hole concentration can be engineered to control $V_T$ independent of RON, but is very difficult to obtain uniform doping/hole concentration needed ensure consistent gate contact resistance, as well as the $V_T$ across an entire IC device. Moreover it is difficult to grow the p-GaN layer 116 immediately above the barrier layer 106 which can comprise undoped AlGaN. Therefore, there is effectively no 'knob' that allows increasing the $V_T$ for the known E-mode HEMT to a more positive voltage level without increasing the RON. In contrast, disclosed E-mode HEMTs such as E-mode HEMT 150 having a tunnel diode in gate stack provides another knob being the thickness of the InGaN layer 110a to independently increase the $V_T$ of the E-mode HEMT without increasing the RON.

It is possible for the InGaN layer 110a to be doped p-type (e.g., Mg) or doped n-type. Moreover, the doping of the InGaN layer 110a may not be intentional because it is difficult to keep the dopant species fully isolated from adjacent layers comprising doped GaN materials, so that there will likely be unintentional dopants present due to memory effect/diffusion from high temperature processes. This is especially true for p-type doping. Although p-doping or n-doping in the InGaN layer 110a is not needed, the tunnel junction 110 will still generally function as intended even if there is p-type or n-type dopants present.

Disclosed E-mode Group IIIA-N HEMTs such as E-mode HEMT 150 thus eliminate the need for a p-type gate contact needed by known E-mode HEMTs by adding a tunnel diode 110 above the barrier layer 106. The spontaneous and piezoelectric properties of Group IIIA-nitrides along its c-axis enable disclosed tunnel diodes to be capable of flowing high current densities with low tunneling turn-on voltages, such as about 1V. The tunnel diode 110 enables the use of an n-type top contact (e.g., n-GaN layer 110b) for the gate metal to make contact to instead of a conventional p-type top contact. Silicon (Si) is the primary n-type dopant specie in III-N based materials and n-type GaN exhibits significantly superior transport properties than p-type GaN, enables achieving lower contact resistances and better contact resistance uniformity across large areas (gate widths in power switching applications can be several hundreds of millimeters). Furthermore, since source and drain contacts for the E-mode HEMT are n-type, utilization of an n-type contact for the gate enables combining the two steps which eliminates a mask layer, metal deposition and an etch step needed in a conventional process flow for forming known E-mode HEMTs.

As noted above, the tunneling voltage of the tunnel diode 110 can be controlled by adjusting the thickness of the InGaN layer 110a which is generally 35 A to 100 A thick. By decreasing the thickness of the InGaN layer 110a the tunneling voltage of the tunnel diode 110 can be increased. Thus, the $V_T$ of the E-mode HEMT can be increased beyond the limitation of the conventional p-GaN 116/AlGaN barrier layer 106/GaN active layer 104 stack in a known E-mode HEMT. Furthermore, by selectively etching off the tunnel diode by etching off the n-GaN layer 110b and InGaN layer 110a above the p-GaN layer 116 in some of the HEMTs, two different $V_T$ can be provided for E-mode HEMTs on the same die.

Figure 2A:
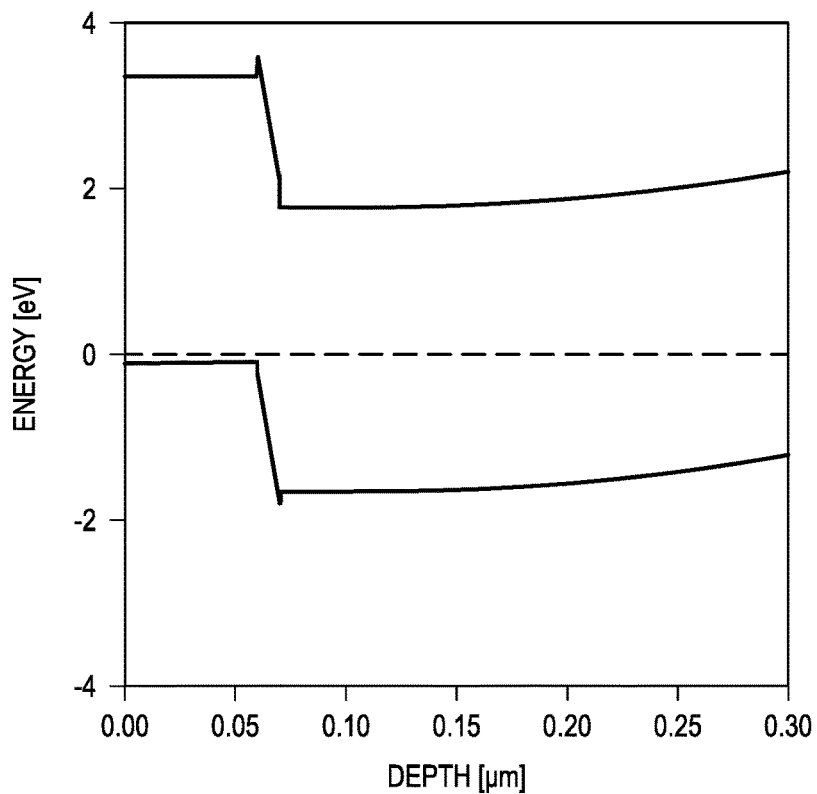
FIGS. 2A and 2B provide a band diagram comparison in the region below the gate for an E-mode Group IIIA-N HEMT without a tunnel diode in the gate stack, and a disclosed E-mode Group IIIA-N HEMT having a tunnel diode in the gate stack according to an example embodiment.
Figure 2B:
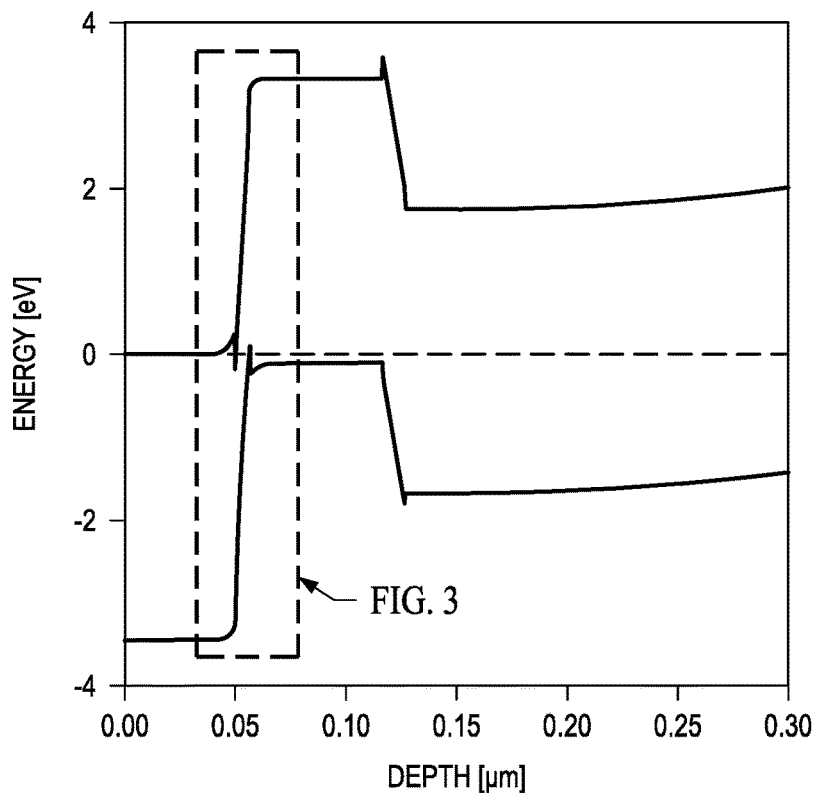

FIGS. 2A and 2B provide a band diagram comparison in the region below the gate for an E-mode HEMT with a tunnel diode in the gate stack and a disclosed E-mode HEMT with a tunnel diode in the gate stack. The y-axis is electron energy which is plotted again depth (or distance) in μm from the interface between the p-GaN layer 116 and the barrier layer 106. (interface depth=0). Both the valence band (at the bottom) and the conduction band (at the top) are shown. The edges of the conduction band and valence band are separated by the band gap energy shown being about 3.3 eV. For E-mode HEMT 150 the n-GaN layer 110b was 500 A thick and the InGaN layer 110a was 64 A thick, and for both the E-mode HEMT without the tunnel diode in the gate stack and the E-mode HEMT 150 with the tunnel diode 110 in the gate stack the p-GaN layer 116 was 600 A thick, and had Mg doping of $4\times10^{19}$ cm$^{-3}$ and a Si doping of $1\times10^{19}$ cm$^{-3}$. From this band diagram comparison it can be concluded that the addition of the tunnel diode 110 above the p-GaN layer 116 has no measurable effect on the band structure beneath, thus maintaining same capability to block lateral current with the gate 114 of the E-mode HEMT held at zero volts.

Figure 3:
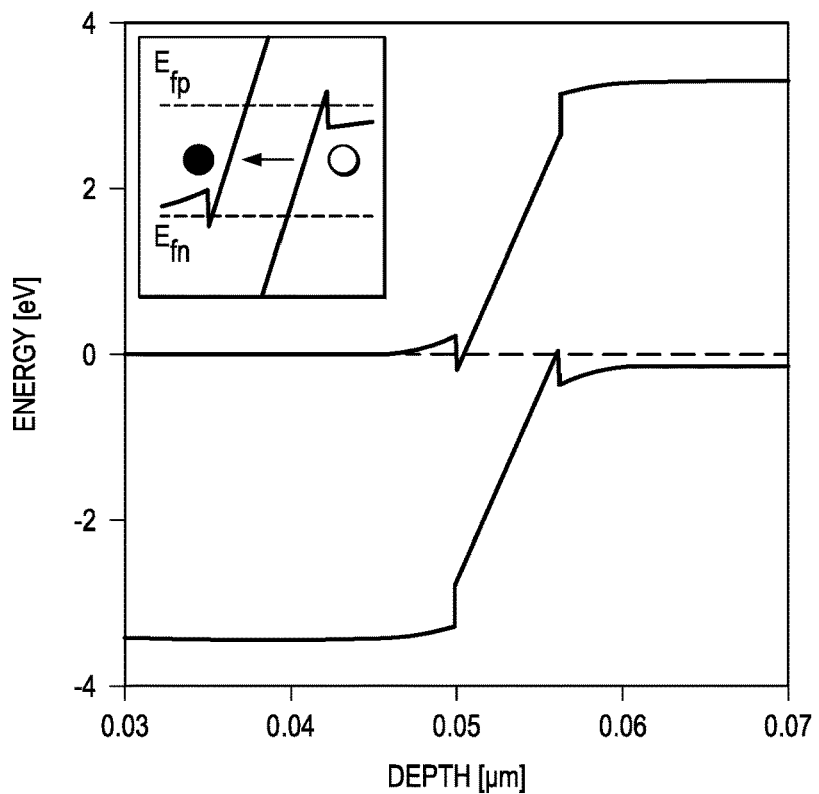
FIG. 3 shows a band diagram in the region under the gate stack of a disclosed E-mode Group IIIA-N HEMT as a function of depth with the Inset provided showing tunneling through the InGaN layer shown under forward bias with the respective Fermi levels shown ($E_{fp}$ and $E_{fn}$), according to an example embodiment.

FIG. 3 shows a band diagram in the region under the gate stack of a disclosed E-mode HEMT (such as E-mode HEMT 150 in FIG. 1) as a function of depth with the valence band (at the bottom) and conduction band (at the top) again shown with the inset provided showing hole tunneling through the InGaN layer 110a under forward bias with both the respective Fermi levels ($E_{fp}$ and $E_{fn}$) shown, according to an example embodiment. As a positive bias is applied to the gate 114, holes in the p-GaN layer 116 tunnel through the tunnel diode 110 (which is thin as described above) and are swept out towards the gate 114. A 2DEG 'channel' will thus form just beneath the barrier layer 106 (e.g., AlGaN) active layer 104 (e.g., GaN) interface, allowing current to flow through the active layer 104 with a voltage applied between the drain contact and source contact of the E-mode HEMT.

Figure 4:
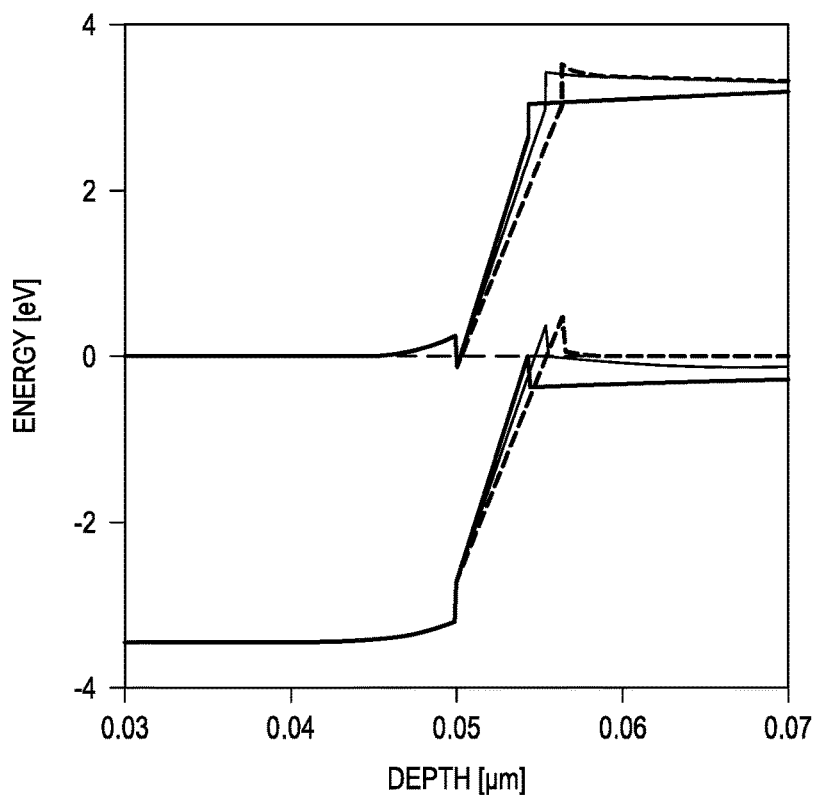
FIG. 4 shows a band diagram in the region under the gate stack of a disclosed E-mode Group IIIA-N HEMT as a function of depth with different InGaN layer thicknesses, according to an example embodiment.

FIG. 4 shows a band diagram in the region under the gate stack of a disclosed E-mode HEMT as a function of depth with different InGaN layer 110a thicknesses, where the valence band (at the bottom) and conduction band (at the top) are again shown. This FIG. evidences a different amount of band-offset resulting from a different thicknesses of the InGaN layer 110a. Less band offset requires more gate voltage to be applied before tunneling occurs>resulting in higher $V_T$. The InGaN layer thickness values shown are for 64 A (highest energy shown), 54 A (intermediate energy shown), and 44 A (lowest energy shown) evidencing that the tunneling voltage can be increased by decreasing the thickness of the InGaN layer 110a to provide an additional knob to increase the $V_T$ of the E-mode HEMT. A thinner InGaN layer 110a means there will be less band offset, requiring more positive bias (higher $V_T$) to force the tunneling to occur. The thicknesses of the InGaN layer 110a is thus an additional knob to increase the $V_T$ of disclosed E-mode HEMTs beyond just the conventional knobs for E-mode HEMTs being only the p-GaN layer 116 thickness/doping and the barrier layer 106 (e.g., AlGaN) thickness/composition.

Figure 5:
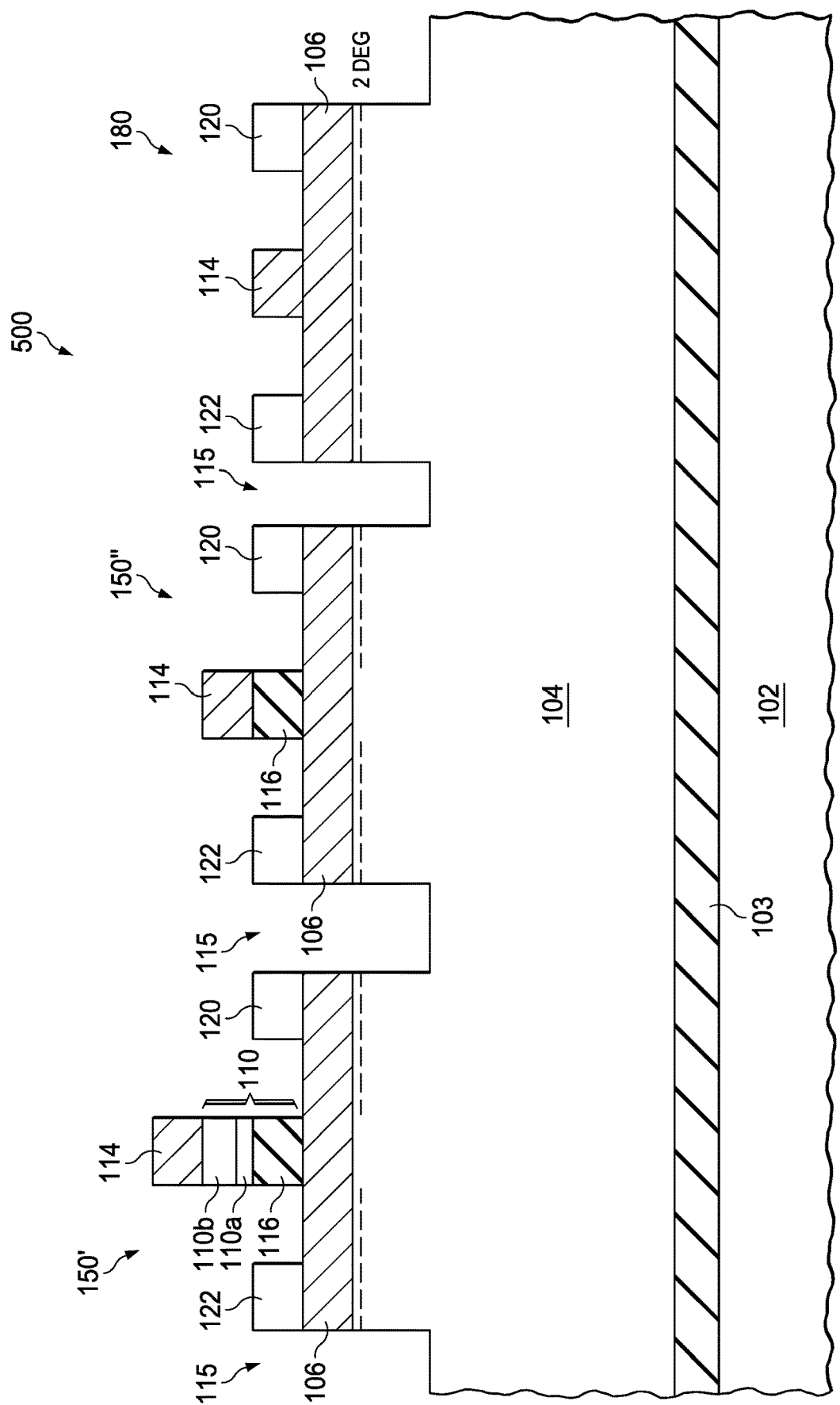
FIG. 5 is a cross sectional view of a portion of an example IC having an E-mode Group IIIA-N HEMT power device with a threshold $V_{T1}$, an E-mode low voltage (LV) Group IIIA-N HEMT device with a threshold $V_{T2}$, and a D-mode LV Group IIIA-N HEMT device with a threshold $V_{T3}$, where $V_{T1} > V_{T2} > V_{T3}$, according to an example embodiment.

FIG. 5 is a cross sectional view of a portion of an example IC 500 having an E-mode HEMT power device with a threshold $V_{T1}$ shown as E-mode HEMT 150', an E-mode low voltage (LV) HEMT device with a threshold $V_{T2}$ shown as E-mode HEMT 150'', and a depletion (D)-mode LV HEMT device with $V_{T3}$ shown as HEMT 180. $V_{T1}>V_{T2}>V_{T3}$. With a p-GaN layer 116 on the gate area for only E-mode HEMTs, E-mode HEMTs and D-mode HEMTs can be fabricated together on the same die (and same wafer during fabrication) for integration of power switching devices being high $V_T$ E-Mode high voltage HEMTs and control circuitry being lower voltage devices including lower $V_T$ E-Mode HEMTs and depletion mode HEMTs. However, without a regrowth process, the $V_T$ of the high voltage power switching E-mode device and the low voltage E-mode device for control circuitry will be the same. While a higher $V_T$ is desired for power switching devices, a lower $V_T$ is generally desirable for the control circuitry. Disclosed embodiments thus enable a higher $V_T$ for the power switching device shown as E-mode HEMT 150' by including a tunnel diode 110 over the barrier layer 106 and a lower $V_T$ for the control circuitry devices shown as E-mode HEMT 150" by not including a tunnel diode 110 (e.g., by etching it off) over the p-GaN layer 116, as well as an optional D-mode HEMT 180 by lacking the tunnel diode and the p-GaN layer 116 on the gate area. E-mode HEMT 150" can have the same metal gate as E-mode HEMT 150'. As described above, different E-Mode HEMT $V_T$ values may be set by having different InGaN layer 110a thickness.

Figure 6A:
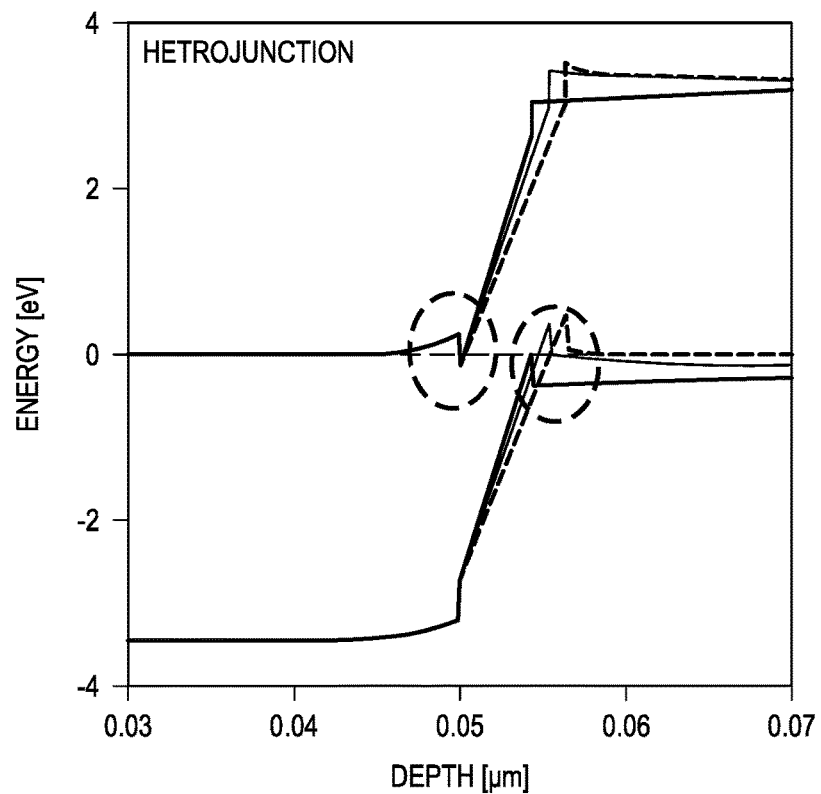

FIG. 6A shows a band diagram in the region under the gate stack of a disclosed E-mode HEMT as a function of depth for a non-graded tunnel diode heterojunction. The non-graded tunnel diode heterojunction is the simplest implementation of the tunnel junction for disclosed e-HEMTs. The different curves are for different thicknesses of the InGaN layer 110a, again being 64 A (highest energy shown), 54 A (intermediate energy shown), and 44 A (lowest energy shown). As before, both the valence band (at the bottom) and conduction band (at the top) are shown.

Figure 6B:
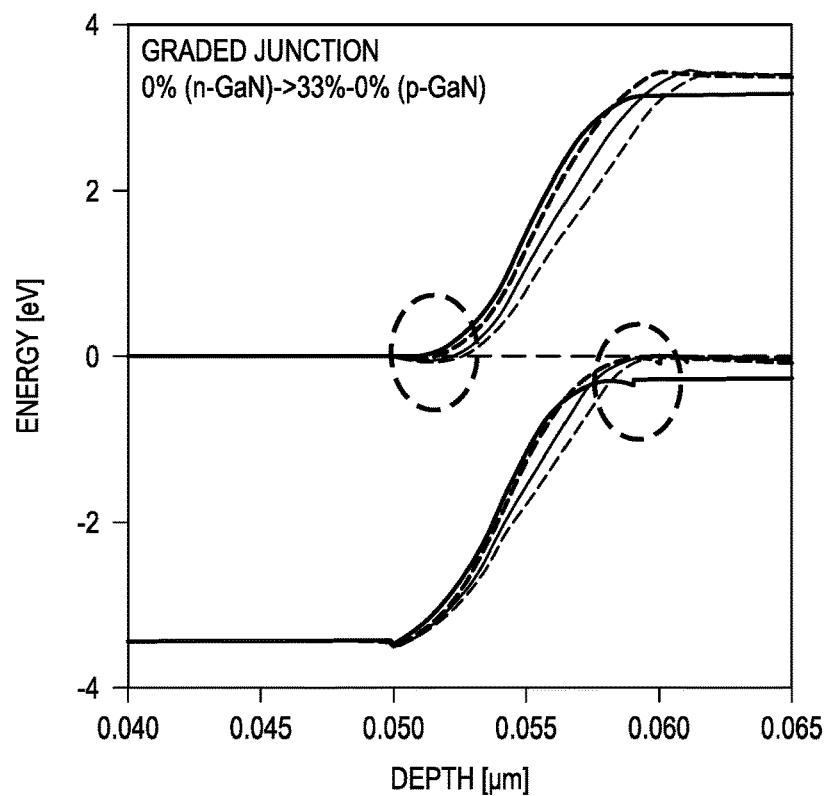
FIG. 6B shows a band diagram in the region under the gate stack of a disclosed E-mode Group IIIA-N HEMT as a function of depth for a graded tunnel diode junction evidencing grading of the In concentration in the InGaN layer for barrier reduction, according to an example embodiment.

FIG. 6B shows a band diagram in the region under the gate stack of a disclosed E-mode HEMT as a function of depth for a graded tunnel diode junction having linear grading of the In concentration in the InGaN layer 110a from 0% to 33% for barrier reduction, where the different curves are again for different thicknesses of the InGaN layer 110a. The 4 curves shown represent graded region thicknesses for the InGaN layer 110a ranging from 90 A to 120 A in steps of 10 A. From the p-GaN 116 side the In content goes from 0 to 33%. Similarly, from the n-GaN 110b side the In content goes from 0 to 33%. Both sides are linearly graded over ½ the thickness of the InGaN layer 110a. As before, both the valence band (at the bottom) and conduction band (at the top) are shown. Since there is conduction band and valence band off-sets between the p-GaN layer 116 and n-GaN layer 110b and the InGaN layer 110a, there is an energy barrier (circled regions shown) that contributes to tunneling resistance. The conduction and valence band off-set is always present between GaN and InGaN regardless of the p or n type doping. With the graded tunnel diode junction E-HEMT implementation shown in FIG. 6B the band-offsets shown in FIG. 6A disappear, allowing for less resistive current flow for the E-HEMT.

Figure 7A:
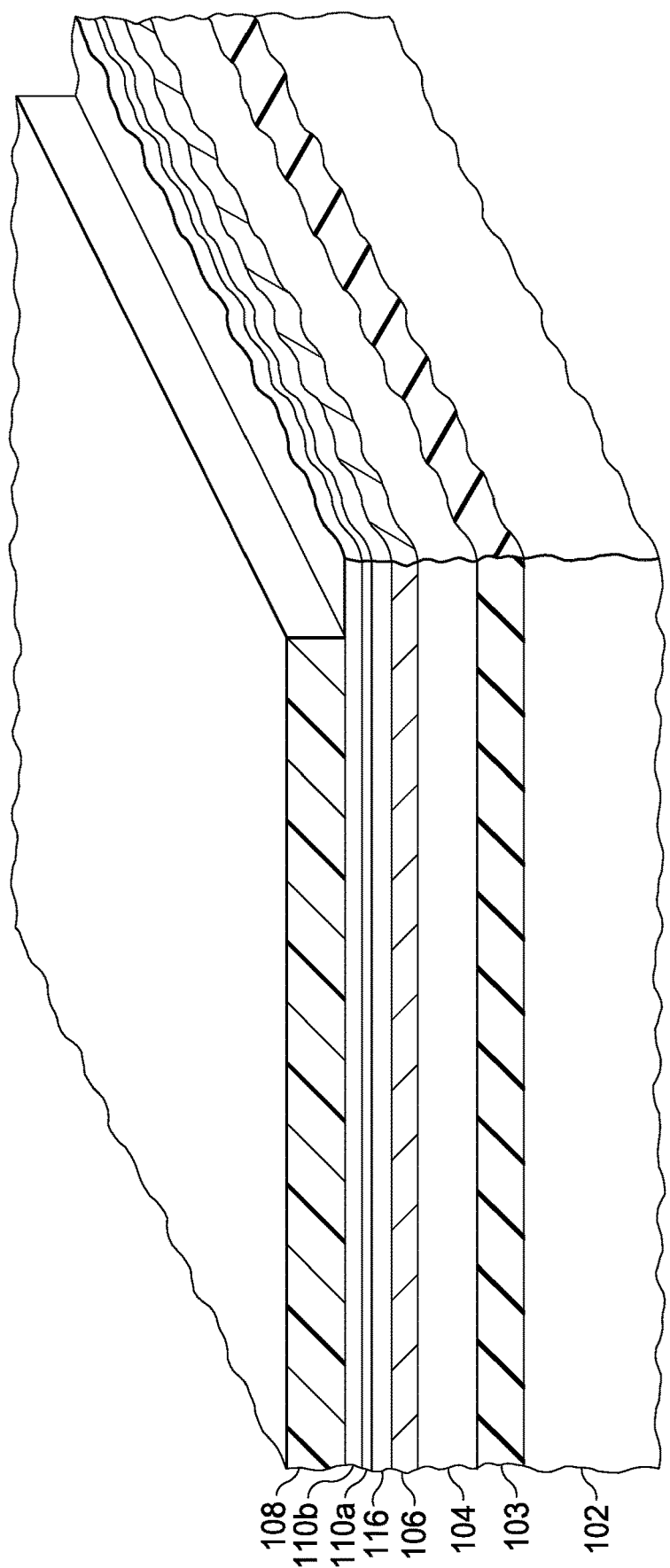
FIGS. 7A-E show successive cross sectional views corresponding to steps in an example method for forming an E-mode Group IIIA-N HEMT having a tunnel diode in the gate stack, according to an example embodiment.

FIGS. 7A-7E show successive cross sectional views corresponding to steps in an example method for forming an E-mode HEMT having a tunnel diode in the gate stack, according to an example embodiment. The starting material in FIG. 7A is shown including an n-type GaN layer 110b on an InGaN layer 110a on a p-GaN layer 116 that is on the barrier layer 106. The barrier layer 106 is on a Group IIIA-N active layer 104 (e.g., GaN) on at least one Group IIIA-N buffer layer 103 that is on a substrate 102. A patterned masking material 108 is on the n-type Group IIIA-N layer 110b. As noted above, the substrate 102 can comprises sapphire, silicon, silicon carbide (SiC) or GaN. The Group IIIA-N buffer layer 103 shown is generally present on the substrate 102, but is not needed when a GaN substrate is used. All the layers on the substrate 102 (Group IIIA-N layer 110b, InGaN layer 110a, p-Group IIIA-N layer 116, barrier layer 106, Group IIIA-N active layer 104 and Group IIIA-N buffer layer 103 can be deposited in the same reactor in one growth run without breaking vacuum.

The n-GaN layer 110b, InGaN layer 110a, p-GaN layer 116, barrier layer 106, active layer 104, and the buffer layer 103 are generally all epitaxial layers formed on the substrate 102, such as using molecular beam epitaxy (MBE) or metal organic chemical vapor deposition (MOCVD). In one arrangement the substrate 102 comprises silicon, the Group IIIA-N active layer 104 comprises undoped GaN, the barrier layer 106 comprises AlGaN, and the p-GaN layer 116 has both Mg and Si doping. The patterned masking material 108 (e.g., photoresist) shown on the barrier layer 106 is used to define the isolation regions 115 (see isolation region 115 in FIG. 7B described below) which border active areas (barrier layer 106 on active layer 104) where HEMTs are formed in.

Figure 7B:
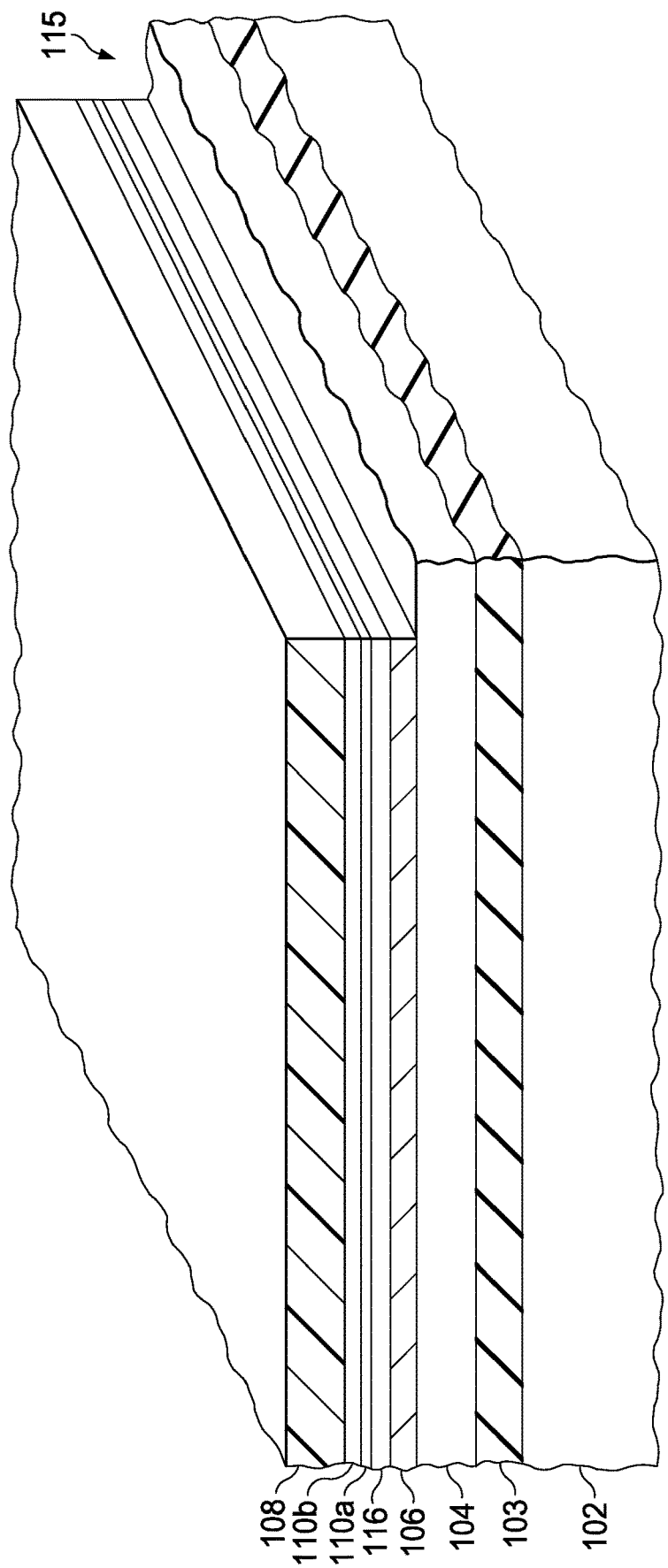

FIG. 7B shows the in-process example E-mode HEMT after forming at least one isolation region through the n-GaN layer 110b, InGaN layer 110a, p-GaN layer 116 and the barrier layer 106, also shown removing a part of the active layer 104 to provide at least one isolated active area comprising the barrier layer 106 on the active layer 104. The masking material 108 will then be stripped.

Figure 7C:
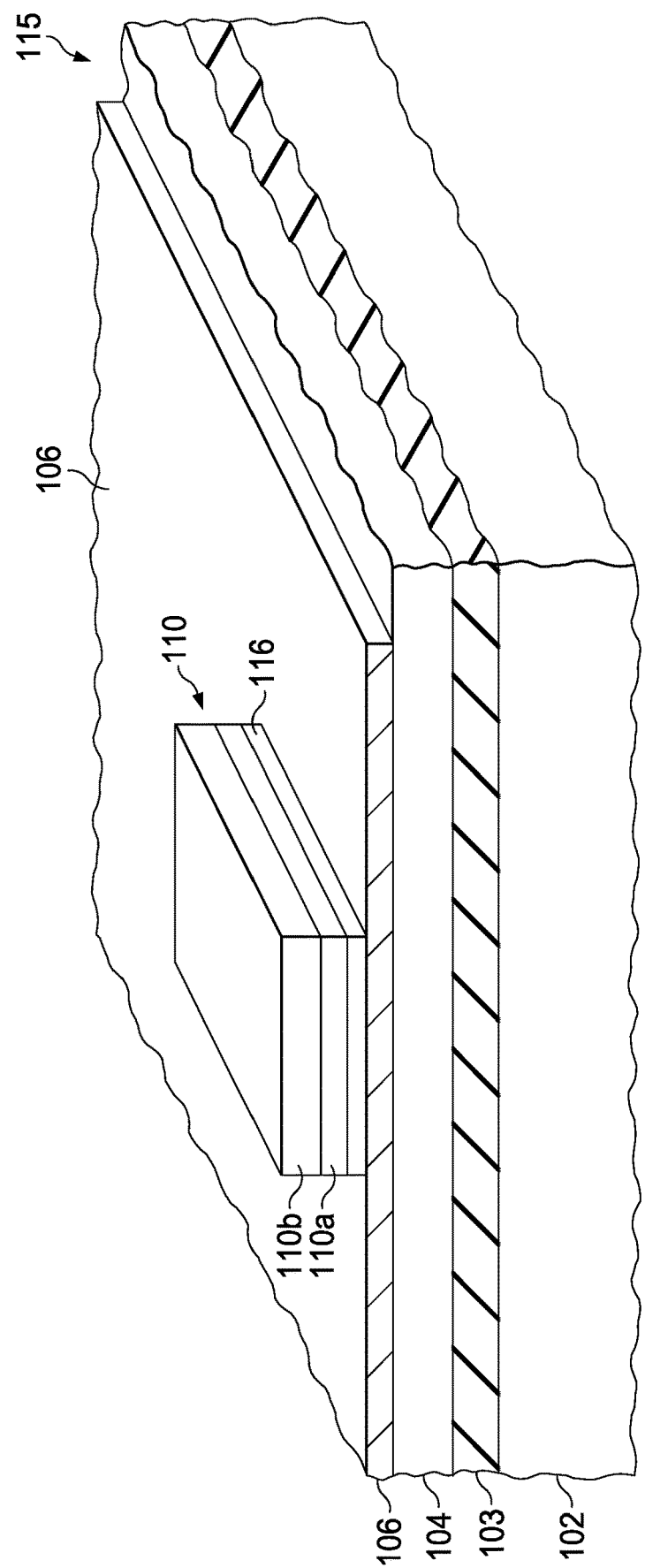

FIG. 7C shows the in-process example E-mode HEMT after defining a tunnel diode 110 comprising an n-GaN layer 110b on an InGaN layer 110a that is on the p-GaN layer 116. A masked etch can be used to etch the stack comprising the n-GaN layer 110b on a InGaN layer 110a on the p-GaN layer 116 to define the tunnel diode 110 on one or more regions of the die. To form the IC 500 shown in FIG. 5 having different $V_T$ E-mode devices on the same die, the tunnel diode etch process can define a tunnel diode for the HV E-mode HEMT 150' to provide threshold voltage $V_{T1}$, remove the tunnel diode for forming the LV E-mode HEMT 150" with threshold voltage $V_{T2}$, and also remove the tunnel diode (and then remove the p-Group IIIA-N layer 116 in a separate step) to form the LV D-mode HEMT 180 with $V_{T3}$, where $V_{T1} > V_{T2} > V_{T3}$. Another method etches off the InGaN layer 110a and the n-GaN layer 110b at an earlier step using another mask step, and to etch the $V_{T1}$ and $V_{T2}$ E-mode HEMT gate stacks in separate steps.

Figure 7D:
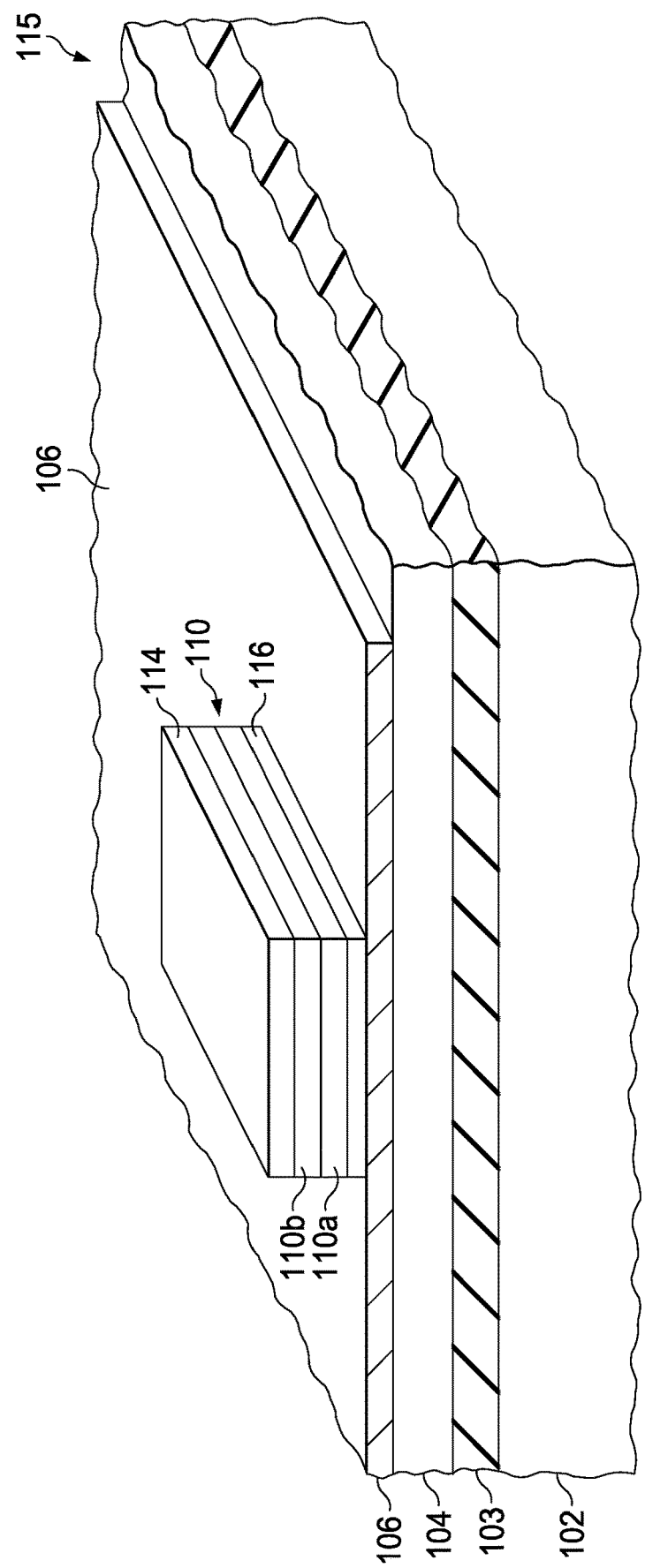

FIG. 7D shows the in-process example E-mode HEMT after forming a gate electrode 114 over the n-GaN layer 110b. This step can form the gate electrode 114 over other devices on the die or wafer. As noted above the tunnel diode 110 providing an n-type surface allows the gate metal to comprise conventional silicon fab metal materials including titanium (Ti) or aluminum, such as TiW or a Ti/Al/TiN metal stack. Alternatively, other metal stacks can include a Ti/Al/Ni/Au stack, Ti/Al stack, Ti/Al/Ni/Ti stack, Ti/Al/Mo/Au stack, Ni/Al stack, or a Ti/Au/Ti stack.

In an alternate embodiment a self-aligned gate fabrication flow can be used. In this alternate embodiment a single mask level etches the gate metal for gate 114 as well as the n-GaN 110b/InGaN 110a/p-GaN 116 stack. Yet another embodiment has the n-GaN 110b/InGaN 110a/p-GaN 116 stack etched off first in the 'access' regions and all other areas other than the gate region where tunnel diodes are intended, and then the gate metal for gate 114 is realigned to the patterned n-GaN 110b/InGaN 110a/p-GaN 116 stack. This realigned approach typically includes some form of deposited dielectric material (e.g., SiN) covering the gate stack followed by forming an opening in the dielectric material to provide contact the gate, followed by gate metal formation.

Figure 7E:
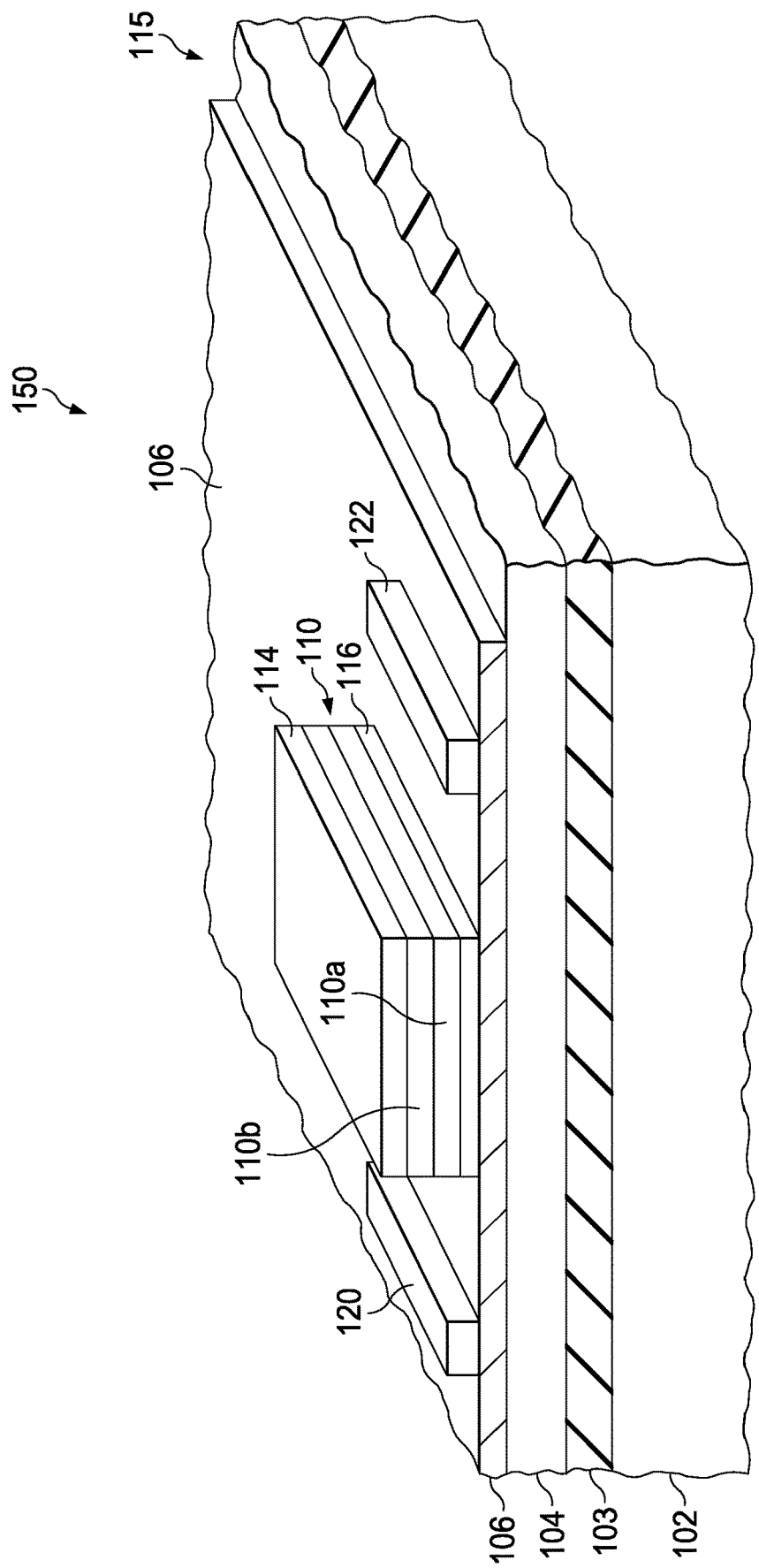

FIG. 7E shows the in-process example E-mode HEMT now shown as 150 after forming a drain 120 having the drain contact shown on the barrier layer 106 to provide contact to the active layer 104 and a source 122 having the source contact shown on the barrier layer 106. Although not shown in FIG. 7E, as described above the source contacts of the source and drain contacts of the drain are in thinned areas of the barrier layer 106 to provide good (low resistance ohmic) contact to the 2DEG in the active layer 104 near the interface between the barrier layer 106 and the active layer 104.

This step can form the drain 120 having the drain contact and source 122 having the source contact for other devices on the die or wafer. The metal for the source 122, drain 120 and gate 114 can be formed in a single deposition, followed by a single lithography level. Alternatively, the gate 114 can deposited then defined and the drain 120 and source 122 can be deposited and the defined together.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An electronic device, comprising:
a substrate;
a Group IIIA-N active layer on said substrate;
a Group IIIA-N barrier layer on said active layer;
at least one isolation region through said barrier layer to provide at least one isolated active area comprising said barrier layer on said active layer;
a p-GaN layer on said barrier layer;
a tunnel diode comprising a n-GaN layer on an InGaN layer on said p-GaN layer;
a gate over said n-GaN layer;
a drain having a drain contact on said barrier layer to provide contact to said active layer, and
a source having a source contact on said barrier layer to provide contact to said active layer.

2. The electronic device of claim 1, wherein said InGaN layer is doped n-type.

3. The electronic device of claim 1, wherein said InGaN layer is doped p-type.

4. The electronic device of claim 1, wherein said InGaN layer includes a linearly graded In concentration in a thickness direction for reducing a barrier voltage of said tunnel diode.

5. The electronic device of claim 1, wherein a thickness of said InGaN layer is from 3.5 nm to 100 nm.

6. The electronic device of claim 1, wherein said substrate comprises sapphire, silicon, or silicon carbide (SiC).

7. The electronic device of claim 1, wherein said gate comprises titanium or aluminum.

8. The electronic device of claim 1, wherein said E-mode HEMT is part of an integrated circuit (IC) formed in and on said substrate.

9. The electronic device of claim 1, wherein said E-mode HEMT is a first E-mode HEMT and further comprising at least a second E-mode HEMT, wherein said InGaN layer for said first E-mode HEMT and said second E-mode HEMT have a different thickness for providing a different threshold voltage ($V_T$) for said first E-mode HEMT compared to said second E-mode HEMT.

10. The electronic device of claim 9, further comprising a depletion-mode HEMT on said IC.

11. The electronic device of claim 1, wherein said p-GaN layer includes both magnesium and silicon doping.

12. An integrated circuit, comprising:
a gate stack located over a first group IIIA-N layer, the first group IIIA-N layer being located on a second group IIIA-N layer, and the gate stack having a topmost n-type group IIIA-N layer; and
a gate electrode directly on the topmost n-type group IIIA-N layer.

13. The integrated circuit of claim 12, wherein said n-type layer comprises silicon.

14. The integrated circuit of claim 12, wherein said gate stack comprises an InGaN layer between two GaN layers.

15. The integrated circuit of claim 12, wherein said gate electrode comprises Ti or Al.

16. The integrated circuit of claim 12, wherein said gate stack is a first gate stack of a first transistor, and further comprising forming a second gate stack of a second transistor on the first group IIIA-N layer, the first gate stack including a first ternary semiconductor layer between two binary semiconductor layers, and the first gate stack including a second ternary semiconductor layer between two binary semiconductor layers, wherein the first and second ternary semiconductor layers have different thicknesses.

17. The integrated circuit of claim 12, further comprising source and drain electrodes located over the first group IIIA-N layer and formed from a same metal layer as the gate electrode.

18. A transistor, comprising:
source and drain electrodes located over a group IIIA-N barrier layer; and
a gate stack comprising a tunnel diode located on said barrier layer between the source electrode and the drain electrode.

19. The transistor of claim 18, wherein said gate stack includes a topmost group IIIA-N layer doped with silicon.

20. The transistor of claim 18, wherein said gate stack comprises an InGaN layer between an n-type GaN layer and a p-type GaN layer, said gate electrode being formed directly on said n-type GaN layer.

21. The transistor of claim 18, wherein said gate electrode comprises Ti or Al.

* * * * *